US012628685B2

(12) United States Patent
Vincent et al.

(10) Patent No.: US 12,628,685 B2
(45) Date of Patent: May 12, 2026

(54) DOUBLE-SIDED MULTICHIP PACKAGES WITH DIRECT DIE-TO-DIE COUPLING

(71) Applicant: NXP USA, Inc., Austin, TX (US)

(72) Inventors: Michael B. Vincent, Chandler, AZ (US); Scott M Hayes, Chandler, AZ (US); Zhiwei Gong, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 361 days.

(21) Appl. No.: 18/458,705

(22) Filed: Aug. 30, 2023

(65) Prior Publication Data

US 2025/0079381 A1 Mar. 6, 2025

(51) Int. Cl.
| | | |
|---|---|---|
| *H10W 74/10* | (2026.01) | |
| *H10W 70/09* | (2026.01) | |
| *H10W 70/60* | (2026.01) | |
| *H10W 70/652* | (2026.01) | |
| *H10W 72/90* | (2026.01) | |

(Continued)

(52) U.S. Cl.
CPC .......... *H10W 74/117* (2026.01); *H10W 90/00* (2026.01); *H10W 90/722* (2026.01); *H10W 70/09* (2026.01); *H10W 70/60* (2026.01); *H10W 70/6528* (2026.01); *H10W 72/9445* (2026.01);

(Continued)

(58) Field of Classification Search
CPC ............. H01L 21/486; H01L 23/49827; H01L 25/0652; H01L 25/0657; H01L 25/16; H01L 25/105; H01L 2224/06134; H01L 2224/06164; H01L 23/3107; H01L 2225/1041; H10W 90/722; H10W 90/792; H10W 90/20; H10W 90/00; H10W 90/297; H10W 70/635; H10W 70/095;

(Continued)

(56) References Cited

U.S. PATENT DOCUMENTS

| 6,274,929 B1 | 8/2001 | Leong et al. |
|---|---|---|
| 8,729,714 B1 | 5/2014 | Meyer |

(Continued)

FOREIGN PATENT DOCUMENTS

| DE | 10 2013 113 A1 | 7/2014 |
|---|---|---|
| EP | 3157056 A2 | 4/2017 |

(Continued)

OTHER PUBLICATIONS

U.S. Appl. No. 18/062,445; not yet published; 36 pages (Dec. 6, 2022).

*Primary Examiner* — Didarul A Mazumder

(57) ABSTRACT

A multi-chip package includes two electronic components bonded to each other via electrical contacts on corresponding faces of the components that are directly opposite each other. The components are encapsulated in a volume of molding material that includes a upper and lower sets of redistribution layers disposed on upper and lower surfaces of the volume of molding material that include electrical interconnects. The package includes one or more through-package interconnects that pass through the molding material. A first through-package interconnect couples an electrically conductive interconnect in a first redistribution layer to an electrically conductive interconnect in a second redistribution layer on an opposite side of the volume of molding material from the first redistribution layer, or it couples the interconnect to one of the components within the volume of molding material.

21 Claims, 7 Drawing Sheets

100

(51) Int. Cl.
   *H10W 90/00* (2026.01)
   *H10W 90/20* (2026.01)
(52) U.S. Cl.
   CPC .......... *H10W 90/20* (2026.01); *H10W 90/297* (2026.01); *H10W 90/792* (2026.01)
(58) Field of Classification Search
   CPC ........... H10W 90/291; H10W 72/9413; H10W 74/111; H10W 70/60; H10W 70/05
   USPC ........................................................ 257/621
   See application file for complete search history.

(56) References Cited

U.S. PATENT DOCUMENTS

| | | | |
|---|---|---|---|
| 8,754,514 | B2 | 6/2014 | Yu et al. |
| 8,765,527 | B1 | 7/2014 | Koey |
| 10,347,598 | B2 | 7/2019 | Baek et al. |
| 10,580,758 | B2 | 3/2020 | Ganesan et al. |
| 11,251,157 | B2 | 2/2022 | Yang et al. |
| 2009/0127686 | A1 | 5/2009 | Yang et al. |
| 2012/0261838 | A1 | 10/2012 | Braunisch et al. |
| 2015/0255411 | A1 | 9/2015 | Karhade et al. |
| 2016/0086930 | A1* | 3/2016 | Koey ...................... H01L 24/20 257/773 |
| 2017/0207197 | A1* | 7/2017 | Yu ........................... H01L 24/14 |
| 2020/0364600 | A1 | 11/2020 | Elsherbini et al. |
| 2021/0111156 | A1 | 4/2021 | Elsherbini et al. |
| 2021/0265274 | A1 | 8/2021 | Joo et al. |
| 2021/0384134 | A1 | 12/2021 | Liu |
| 2022/0262766 | A1* | 8/2022 | Chen .................. H01L 25/0652 |

FOREIGN PATENT DOCUMENTS

| | | | |
|---|---|---|---|
| EP | 4024450 | A1 | 7/2022 |
| WO | 2013127035 | A | 9/2013 |

* cited by examiner

DOUBLE-SIDED MULTICHIP PACKAGES WITH DIRECT DIE-TO-DIE COUPLING

TECHNICAL FIELD

Embodiments of the subject matter described herein relate to polymeric packages for semiconductor devices and other electronic components and methods of fabricating such packages.

BACKGROUND

Semiconductor devices and other electronic devices are frequently assembled into packages to protect the devices from damage and to provide macroscopic electrical contacts. Packages can be made of various materials including polymers and ceramics. It can be desirable to assemble multiple devices within one package in order to reduce the volume required for various components in larger assemblies. It can also be desirable to interconnect multiple devices within a multi-chip package to save space and/or to improve device performance characteristics such as maximum clock speeds, power dissipation, and the like.

SUMMARY

In an example embodiment, an electronic device package includes a first electronic component that has a first surface provided with electrical contact pads and a second surface opposite the first surface; and a second electronic component that has a first surface provided with electrical contact pads and a second surface opposite the first surface. The first surface of the second electronic component is bonded to the first surface of the first electronic component and a volume of molding material encapsulates the first electronic component and the second electronic component. The electronic device package also includes an upper set of redistribution layers, a lower set of redistribution layers, and a through-package interconnect that passes through the volume of molding material.

The upper set of redistribution layers is formed from layers of electrically-insulating material that surround a first set of electrically conductive interconnects, where the upper set of redistribution layers extends from a first surface of the volume of molding material to an upper redistribution layer ("RDL") surface. The lower set of redistribution layers is formed from layers of electrically-insulating material that surround a second set of electrically conductive interconnects. The lower set of redistribution layers extends from a second surface of the volume of molding material that is opposite the first surface of the volume of molding material to a lower RDL surface.

The through-package interconnect electrically couples an electrically conductive interconnect in a first redistribution layer to an electrically conductive interconnect in a second redistribution layer on an opposite side of the volume of molding material from the first redistribution layer; or the through-package interconnect electrically couples an electrically conductive interconnect in the first redistribution layer to an electrical contact pad belonging to the first electronic component or an electrical contact pad belonging the second electronic component.

In another example embodiment, a method includes providing a first electronic component having a first surface provided with electrical contact pads and a second surface opposite the first surface; and a second electronic component having a first surface provided with electrical contact pads and a second surface opposite the first surface. The first surface of the second electronic component is bonded to the first surface of the first electronic component and a volume of molding material encapsulates the first electronic component and the second electronic component. The method further includes forming an upper set of redistribution layers, forming a lower set of redistribution layers, and forming a through-package interconnect that passes through the volume of molding material.

The upper set of redistribution layers is formed from layers of electrically-insulating material that surround a first set of electrically conductive interconnects, wherein the upper set of redistribution layers extends from a first surface of the volume of molding material to an upper redistribution layer ("RDL") surface. The lower set of redistribution layers is formed from layers of electrically-insulating material that surround a second set of electrically conductive interconnects, wherein the lower set of redistribution layers extends from a second surface of the volume of molding material that is opposite the first surface of the volume of molding material to a lower RDL surface.

The through-package interconnect electrically couples an electrically conductive interconnect in a first redistribution layer to an electrically conductive interconnect in a second redistribution layer on an opposite side of the volume of molding material from the first redistribution layer; or the through-package interconnect electrically couples an electrically conductive interconnect in the first redistribution layer to an electrical contact pad belonging to the first electronic component or an electrical contact pad belonging the second electronic component.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
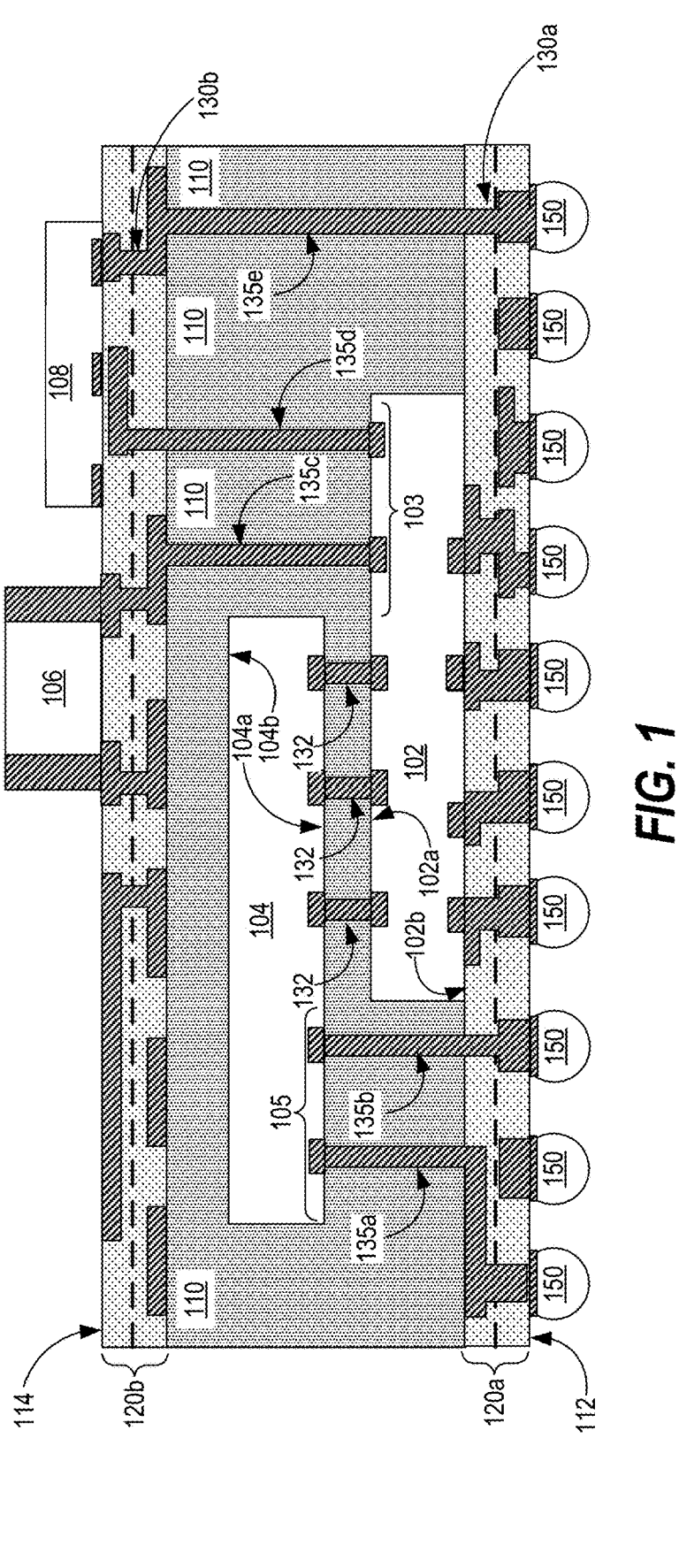
FIG. 1 is a cross-sectional illustration of an example multi-chip package according to one or more embodiments.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Embodiments herein may use any suitable processes including those that omit steps of example processes described herein, perform those steps or similar steps in different orders, and the like. It will also be appreciated that well-known techniques and features may be omitted for clarity.

Previous approaches to multichip packaging include so-called "2D integration" and "2.5D integration" in which multiple devices, including semiconductor device substrates (or "chips") are placed side-by side on a carrier and then interconnected by routing interconnects through interposers placed above or below the carrier. Other approaches, referred to as "3D integration," can include stacking multiple devices on top of each other and interconnecting them using vias and/or other structures to interconnect the die and components in different layers or tiers in a vertical arrangement.

Previous approaches including those described above can have disadvantages that can be addressed by applying methods disclosed herein to produce multichip packages. As an example, methods for fabricating multichip packages according to embodiments described herein enable the placement of semiconductor die and/or other components having different footprints and thicknesses in dense arrangements by allowing the die and components to be embedded in multiple packaging layers and/or across the layers.

Along these lines, FIG. 1 shows an example package 100 according to embodiments herein. Methods of fabricating the example package 100 and similar multichip packages will be discussed further below in connection with FIG. 2. The example package 100 is formed from a volume of molding material 110 that encapsulates at least a first die 102 and a second die 104. Accordingly, embodiments herein can accommodate a wide range of die footprints and thickness by adjusting the thickness of the volume of molding material 110. The example package 100 also includes a component 106 and a component 108 disposed on top of a set of laminated redistribution layers 120 having electrically conductive interconnects 130 routed within. In this example, the component 106 is representative of discrete component such as a resistor, capacitor, or the like which may be significantly thicker than electronic device die similar to the die 102, 104. The component 108 is representative of more compact components such as semiconductor die with bottom contacts configured for surface-mounting via direct bonding or solder reflow, as non-limiting examples. Embodiments herein can also accommodate various additional die, packaged die, or other components disposed above redistribution layers 120 and the routing of the interconnects 130 as needed to accommodate a particular set of die and/or other components.

As explained further below, interconnects 130 in one or more embodiments herein can be routed within the redistribution layers 120 and the volume of molding material 110 to provide connections between components disposed on or within different portions of a package (e.g., the package 100) and also to provide connections to external contact structures (e.g., the solder bumps 150). In the example of FIG. 1, the package 100 has a lower redistribution layer surface (the lower RDL surface 112) and an upper redistribution layer surface (the upper RDL surface 114). Interconnects 130 extend through the redistribution layers 120 to provide external contact areas that are provided with solder bumps 150 to allow the package 100 to be placed on a circuit board, for example. It will be understood that the package 100 is shown with solder bumps 150 on a lower redistribution layer surface (the lower RDL surface 112) for purposes of illustration and that embodiments herein are not limited to utilizing solder bumps or any other specific bonding technologies. Furthermore, it will be appreciated that packages according to embodiments herein are not limited to having electrical contacts on only one surface, or only type of electrical contacts.

It will be understood that packages according to embodiments herein may include a greater or fewer number of die than pictured in FIG. 1 and that various arrangements of die with varying sizes and configurations are possible. For example, in embodiments herein, a package may include die configured to be electrically coupled to contacts (i.e., interconnects 130) using any number of suitable methods, including examples ball bonding, thermocompression bonding, flip chip bonding, solder reflow bonding, and so on as nonlimiting examples.

The bulk of multichip packages according to embodiments herein (e.g., the package 100 as shown in FIG. 1) can be formed entirely from polymeric materials (e.g., molding material 110 and additional polymeric materials forming redistribution layers 120), in contrast to other 3D integration or substrate embedding approaches that require the use of selectively hollowed out printed circuit boards with one or more core layers selectively removed to allow placement of die within voids in the circuit board(s). Advantageously, methods herein allow die having widely disparate sizes and thickness to be integrated within a single package, and, as shown in FIG. 1, it is not necessary in embodiments herein that any particular die be disposed at the same depth as other any die, as in many previous approaches.

The molding material 110 and related molding materials herein can be any suitable material including, as one non-limiting example, epoxy molding compound (EMC) which can include silica and other fillers. As shown, the package 100 includes a first set of redistribution layers 120 (the redistribution layers 120a) and a second set of redistribution layers 120 (the redistribution layers 120b), separated from each other by the volume of molding material 110. Redistribution layers 120 may be formed using any suitable materials, including, as nonlimiting examples: polyimide, epoxy, Polybenzoxazole (PB), Ajinomoto build-up film (ABF) coating, or dry film materials. In one or more embodiments, one or more redistribution layers 120 are formed from the same material as the volume of molding material 110. In one or more embodiments, each redistribution layer (e.g., a redistribution layer 120) is formed from the same material as each other redistribution layer, while in one or more other embodiments, one or more different materials are used for certain redistribution layers.

As shown, the die 102 and the die 104 are both encapsulated by the volume molding material 110. The die 102 has a first surface 102a that includes contact pads which can be bonded to electrically conductive interconnects, as shown, and a second surface 102b opposite the first surface 102a. It will be understood that the die 102 is depicted with copper pillars on the first surface 102a that are suitable connecting to conductive interconnects via electroplating for the purposes of illustration and that, in one or more embodiments, a die such as the die 102 may instead be a die with contacts configured for thermocompression bonding, ball bonding, solder reflow bonding, flip-chip bonding, direct metallurgical bonding, or any other suitable method. Similarly, the die 104 has a first surface 104a provided with electrical contacts and a second surface 104b disposed opposite from the first surface 104a.

In the example of FIG. 1, the die 102 includes an additional set of contacts on its second surface 102b. These contacts can be used as additional electrical interconnections to components on or within the die 102 and can also be used for other purposes such as thermal dissipation and/or electrical grounding, as nonlimiting examples. The contacts on the second surface 102b may also be connected to contacts on the first surface 102a or other structures using through-substrate vias (not shown in FIG. 1; see the example of FIG. 3).

In this example, the die 102 and 104 are positioned "back-to-back" with the first surface 102a of the die 102 bonded to the first surface 104a of the die 104 such that the second surface 102b of the die 102 is facing toward lower RDL surface 112 and the second surface 104b of the die 104 is facing toward the upper RDL surface 114.

In the example of FIG. 1. the die 102, 104 are bonded to each other via direct interconnects 132 (i.e., direct die-to-die interconnects) which also electrically couple the die 102, 104 to each other. The direct interconnects 132 are depicted as metallic pillars bonded to contacts on the die 102, 104. However, it will be understood that interconnects such as the direct interconnects 132 can be formed using any suitable methods and materials, and that die such as the die 102, 104 may be bonded using any suitable methods and materials, including, as non-limiting examples: bonding using dry films, metal loaded pastes, or unloaded pastes. Die such as the die 102, 104 may also be bonded directly to each other via metallurgical bonding of contacts on the surface 102a to contacts on the surface 104a, using processes such as soldering, plating, and bonding via metallic interdiffusion, as nonlimiting examples.

As shown, the additional components 106, 108 are disposed above the second set of redistribution layers 120b and electrically coupled to various interconnects 130b. As above, the component 106 is illustrative of components such as a discrete resistors, capacitors, and inductors which may be significantly thicker than a semiconductor device die. The component 106 can also be illustrative of substrates and packages containing multiple discrete components. In one or more embodiments such components are incorporated into a multichip package using techniques described further below in connection with FIG. 2, for example.

The package 100 includes external contacts (e.g., solder bumps 150 as shown in FIG. 1) which are bonded and electrically coupled to portions of the interconnects 130 that extend through the redistribution layers 120 to the lower RDL surface 112 of the package 100. The package 100 includes one or more through-package interconnects 135 (e.g., the through-package interconnects, 135a,135b, 135c, 135d, and 135e in FIG. 1).

In the example of FIG. 1, the die 102, 104 are stacked in an offset arrangement in which an extended portion 103 of the surface 102a extends beyond the footprint of the die 104 and an extended portion 105 of the surface 104a extends beyond the footprint of the die 102. This arrangement allows for the die 102, 104 to be interconnected as shown while allowing access to the die for through-package interconnects 135 to electrically couple the die to interconnects 130 or other contact structures (e.g., solder bumps 150) on either surface of the volume of molding material 110.

As a result, through-package interconnects according to embodiments herein can originate within a first redistribution layer (e.g., one of the redistribution layers 120a or one of the redistribution layers 120b), and pass through a portion of a volume of molding material such as the volume of molding material 110 to electrically couple a die such as the die 102 or the die 104 within the molding material to one or more corresponding electrical interconnects. For example, the through-package interconnects 135a, 135b pass through the volume of molding material 110 and electrically couple electrical interconnects 130a of the redistribution layers 120a to contacts on the surface 104a of the die 104. Similarly, the through-package interconnects 135c, 135d pass through the volume of molding material 110 and electrically couple electrical interconnects 130b of the redistribution layers 120b to contacts on the surface 102a of the die 102.

Through-package interconnects according to embodiments herein can originate within a first redistribution layer (e.g., one of the redistribution layers 120a or one of the redistribution layers 120b), and can pass through the entire thickness of a volume of molding material (e.g., the volume of molding material 110) to terminate in another redistribution layer on an opposite surface of the volume of molding material 110 (e.g., one or more of the redistribution layers 120a or one or more of the redistribution layers 120b). For example, the through-package interconnect 135e passes through the volume of molding material 110 and electrically couples one of the electrical interconnects 130a of the redistribution layers 120a to one of the electrical interconnects 130b of the redistribution layers 120b (thereby coupling the component 108 on the upper RDL surface 114 to a solder bump on the lower RDL surface 112).

Through-package interconnects according to embodiments herein can also enable direct contact from an interconnect within a redistribution layer to a die through a volume of molding material (e.g., the through-package interconnect 135a, 135b and the through-package interconnects 135c, 135d). Accordingly, in one or more embodiments, a through-package interconnect electrically interconnects an interconnect or component at an upper RDL surface (e.g., a component 106 or 108 on the upper RDL surface 114) to a die within a volume of molding material such as the volume of molding material 110 (e.g., the die 102). In one or more embodiments, a through-package interconnect electrically interconnects an interconnect or component at a lower RDL surface (e.g., an interconnect 130b and/or a solder bump 150) to a die within a volume of molding material such as the volume of molding material 110 (e.g., the die 104). In one or more embodiments, a through-package interconnect (e.g., a direct interconnect 132) may be used to electrically interconnect a first die inside the volume of molding material 110 (e.g., the die 102) to a second die within a volume of molding material (e.g., the die 104).

It will be understood that the description of the package 100 above is intended as an example and that nothing herein is intended to limit embodiments to only two die molded within a package, such as the package 100, to only two through-package interconnects 135 or to only two die on the upper RDL surface 114. It will also be understood that components such as the component 106, 108 or any other suitable components may be attached to the upper RDL surface 114 by any suitable method including ball bonding, compression bonding, solder reflow and the like and that different die may be attached by different methods. It will be further understood that embodiments herein may have different combinations of one or more features described in connection with the example of FIG. 1 and subsequent figures.

Furthermore, in embodiments herein, die such as the die 102, 104 and similar components can be completely surrounded by molding material (e.g., the die 104 as depicted in FIG. 1) or they can be positioned with a surface that contacts one of the redistribution layers. For example, the die 102 is depicted in FIG. 1 with its second surface 102b directly contacting the redistribution layer 120a closest to the volume of molding material 110. As shown, a die such as the die 102 can have contacts on two surfaces. For example, the die 102 is shown with contacts on its second surface coupled to interconnects 130a within the redistribution layers 120a.

Figure 2:
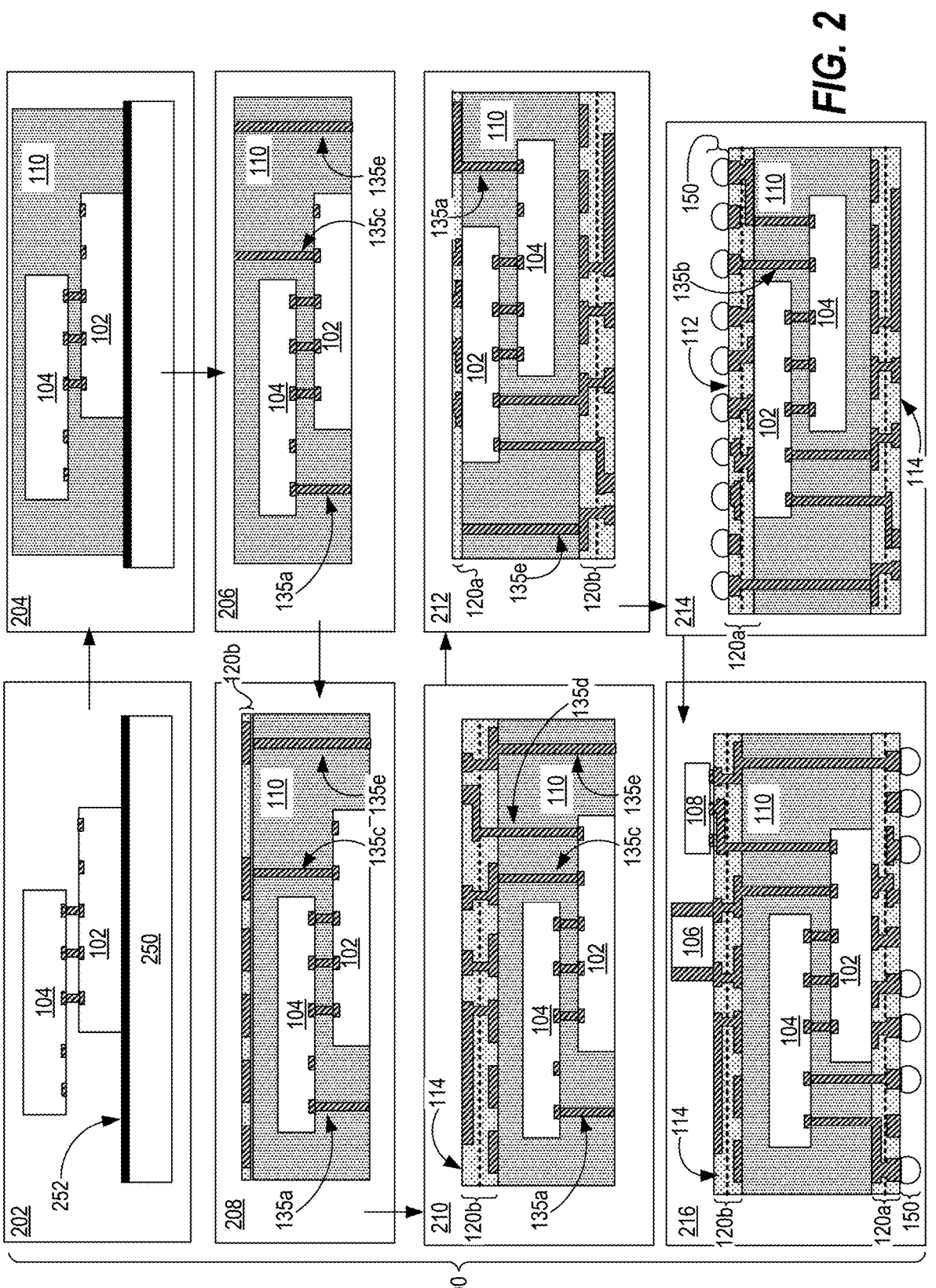
FIG. 2 is a cross-sectional illustration of steps in an example process suitable for fabricating the multi-chip package of FIG. 1.

FIG. 2 illustrates steps in an example process for fabricating a multichip package (e.g., the package 100 of FIG. 1) according to embodiments herein. Accordingly, FIG. 2 illustrates the steps 202, 204, 206, 208, 210, 212, 214, and 216 of the process 200 which are described with reference to the package 100 and the components shown in FIG. 1.

First, at step 202, the die 102 is provided on a carrier substrate 250. The die 104 is placed on top of the die 102 in a "face-to-face" arrangement (i.e., the surface 102a is bonded to the surface 104a as shown in FIG. 1). A release film 252 may be optionally disposed on the carrier substrate 250 between the carrier substrate 250 and the die 102 and can be used to allow the carrier substrate 250 to be removed as described in connection with step 206, below. The die 102 may also be bonded to the die 104 prior to placement on the carrier substrate 250.

At step 204, the volume of molding material 110 is formed, encapsulating the die 102, 104. The molding material 110 may be formed by any suitable process. As nonlimiting examples, the molding material 110 may be dispensed as a liquid, powder, dry film, or paste and compression or injection molded around the die 102, 104, followed by a thermally-activated, chemically-activated, or light-activated curing process, or any other suitable process. The lower RDL surface 112 and the upper RDL surface 114 of the package 100 will ultimately be formed on opposite surfaces of the volume of molding material 110, as shown in FIG. 1.

At step 206, the molding material 110, now encapsulating the die 102, 104, is separated from the carrier substrate 250. In one or more embodiments this can be accomplished by removal of the release film 252 to expose another surface of the molding material 110 in addition to the surface already exposed. Optionally, the molding material 110 can be selectively removed (i.e., thinned) above the die 104 if desired using any suitable process including dry polishing, wet polishing, and/or chemical-mechanical polishing (CMP) to expose the contact areas of the die 104. The molding material 110 is patterned by any suitable process including drilling or etching to form one or more electrically conductive through-package interconnects 135, such as the through-package interconnect 135a as shown at step 206. It will be understood that, in or more embodiments, two or more through-package interconnects 135 are formed at step 206 or a similar step.

In one or more embodiments, one or more through-package interconnects are formed by drilling or otherwise etching a monolithic hole which is then filled with conductive material using any suitable process such as electroplating. For instance, the through-package interconnects 135a, 135c, and 135e may be formed at step 206 by drilling continuous holes though the volume of molding material 110 and plating the holes with a suitable metal.

At step 208, one or more redistribution layers 120 (i.e., redistribution layers 120b) that include electrically conductive interconnects 130 (i.e., interconnects 130b) are formed. It will be appreciated that the number of redistribution layers 120 and sequencing of the formation of those layers can vary depending on specific die to be incorporated in the resulting package and the number and arrangement of desired electrical connections to those die. In addition, the through-package interconnects 135c, and 135e are electrically coupled to one or more of the interconnects 130b within the redistribution layer(s) 120b formed during step 208.

The redistribution layers 120 and the interconnects 130 within those layers, as shown in FIG. 2 and elsewhere, can be formed in a sequential manner using any suitable processes. As one nonlimiting example, a first layer of interconnects 130 may be deposited and patterned on an exposed surface of the molding material 110, followed by deposition dielectric material around them to complete the first redistribution layer 120b. This process may be repeated to build up subsequent redistribution layers 120 including respective portions of the interconnects 130 within. As another nonlimiting example, the interconnects can be formed at least in part using electroplating processes or any other suitable methods.

At step 210, one or more additional redistribution layers 120b including additional interconnects 130b are formed. In this example, an additional through-package interconnect is formed (the through-package interconnect 135d) and coupled to one or more interconnects 130b such that the through-package interconnects 135c, 135d terminate within different redistribution layers 120*b*. It will be understood that nothing in this example is intended to require more than one through-package interconnect or to require two or more through-package interconnects that terminate within different redistribution layers. Rather, it will be appreciated that the number and arrangement of through-package interconnects may be chosen according to the requirements for a particular set of die being packaged. The upper RDL surface 114 is formed at step 210 as shown.

As illustrated at step 212, further processing may be performed with the molding material 110 and the die 102, 104 inverted relative to the orientation depicted in steps 208-210. At step 212, one or more redistribution layers 120 (i.e., the redistribution layers 120*a*) provided with interconnects 130 (i.e., the interconnects 130*a*) are formed on a surface of the volume of molding material 110 that is opposite the upper RDL surface 114. At this step, the through-package interconnect 135*a* is terminated at an electrical interconnect 130*a* in the first redistribution layer 120*a*.

At step 214, one or more additional redistribution layers 120*a* including additional interconnects 130*a* are formed above the redistribution layer(s) 120*a* formed at step 212 to form the lower RDL surface 112. At this step, the through-package interconnect 135*b* is also formed and terminated at an electrical interconnect 130*a* in the bottom redistribution layer 120*a*. Solder bumps 150 (or other suitable electrical contacts) may also applied be applied to corresponding electrical interconnects 130*a* on the lower RDL surface 112 at this step (or at a subsequent step).

At step 216, one or more die or other suitable components (e.g., the components 106, 108 as pictured) are bonded to the upper RDL surface 114 and electrically coupled to interconnects 130*b*. In one or more embodiments, one or more die on the upper RDL surface 114 are coupled via interconnects 130*b* to a die (e.g., the die 102) disposed within the molding material 110. In one or more embodiments, one or more die on the upper RDL surface 114 are coupled via interconnects 130*b* and one or more through-package interconnects 135 (e.g., the through-package interconnect 135*a* and/or the through-package interconnect 135*b*) to a die (e.g., the die 104) disposed within the molding material 110. In one or more embodiments, one or more die on the upper RDL surface 114 are coupled via interconnects 130*b*, one or more through-package interconnects 135 (e.g., the through-package interconnect 135*a* and/or the through-package interconnect 135*b*), and one or more interconnects 130*a* of redistribution layers 120*a* to electrical contacts at the lower RDL surface 112.

If not bonded to the lower RDL surface 112 at step 214, solder bumps 150 or any other suitable electrical contact structures are bonded to corresponding interconnects 130*a* at step 216 or at a subsequent step. It will be appreciated that nothing herein is intended to limit packages according to embodiments herein to ball-grid array (BGA) packages or similar packages. For example, in one or more embodiments, a package such as the package 100 can instead be provided with bond pads or any other suitable contact configuration (e.g., land-grid array (LGA) pads without solder bumps).

In one or more embodiments, the upper RDL surface 114 and the components disposed on the upper RDL surface 114 are encapsulated in an additional volume of molding material 110 disposed on the upper RDL surface 114 (not shown).

Figure 3:
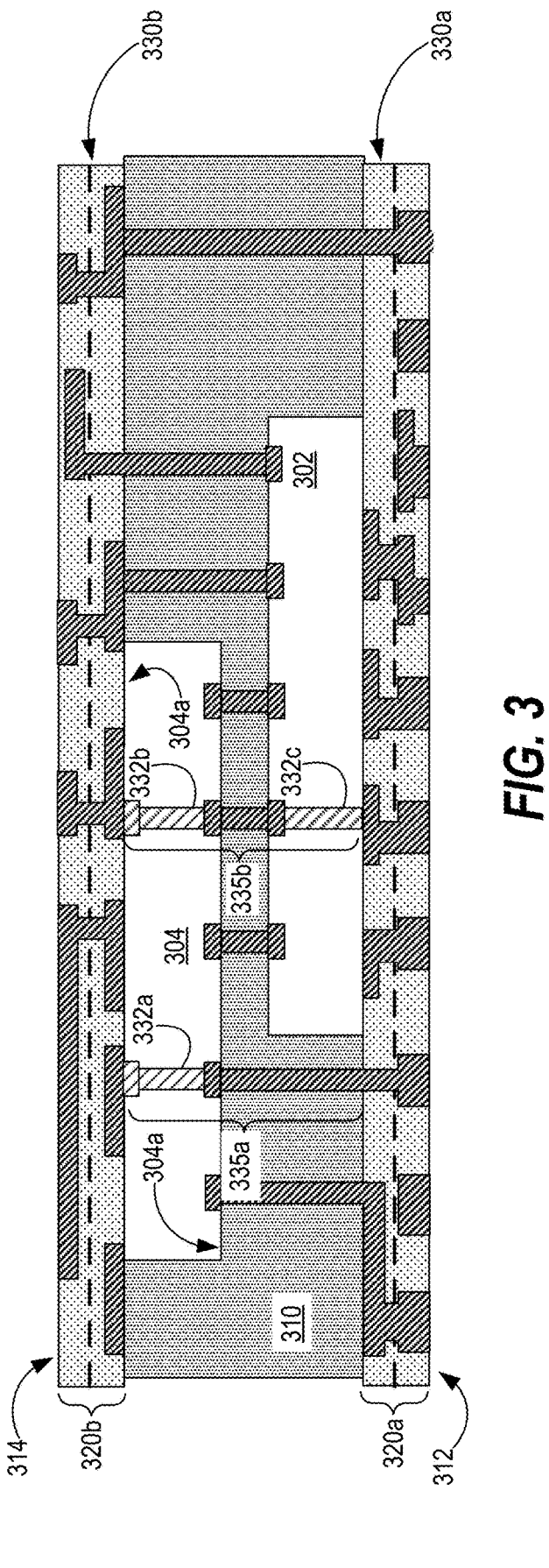
FIG. 3 is a cross-sectional illustration of another example multi-chip package according to one or more embodiments.

FIG. 3 shows elements of an example package 300 according to embodiments herein. Similarly to the example package 100 of FIG. 1, the package 300 includes die 302, 304 (e.g., the die 102, 104) encapsulated within a volume of molding material 310 (e.g., the molding material 110) having a first (lower) set of redistribution layers 320*a* (e.g., the redistribution layers 120*a*) with electrical interconnects 330*a* disposed on a first surface of the volume of molding material 310 and a second (upper) set of redistribution layers 320*b* with electrical interconnects 330*b* disposed on an opposite surface of the volume of molding material 310. Additional components on the RDL surfaces 312, 314 are not shown.

Through-package interconnects according to embodiments herein can also include through-substrate vias that pass through die or other components. For example, the package 300 of FIG. 3 includes die 302, 304 encapsulated within a volume of molding material 310. the through-package interconnect 335*a* couples an interconnect 330*a* within the redistribution layers 320*a* to an interconnect 330*b* within the redistribution layers 320*b*, and includes the through-substrate via 332*b* that passes through the die 304. The through-package interconnect 335*a* also passes through the volume of molding material 310 between the die 304 and the redistribution layer 320*a*. In another example, the through-package interconnect 335*b* also couples an interconnect 330*a* within the redistribution layers 320*a* to an interconnect 330*b* within the redistribution layers 320*b*. However, the package interconnect 335*b* includes the through-substrate via 332*b* that passes through the die 304 and the through substrate via 332*c* that passes through the die 302.

In one or more embodiments a through package interconnect (e.g., the through-package interconnect 335*a* or 335*b*) has a first end that terminates in a first redistribution layer (e.g., a redistribution layer 320*a* or 320*b*) and includes a through-substrate via that passes through a first die disposed within a volume of molding material (e.g., the die 302 or the die 304 within the volume of molding material 310). In one or more embodiments, such a through-package interconnect includes an additional through-substrate via that passes through a second die within the volume of molding material (e.g., the die 304 or the die 302). In one or more such embodiments, the through-package interconnect has a second end that terminates in a second redistribution layer on an opposite side of the volume of molding material (e.g., a redistribution layer 320*b* or 320*a*).

Figure 4:
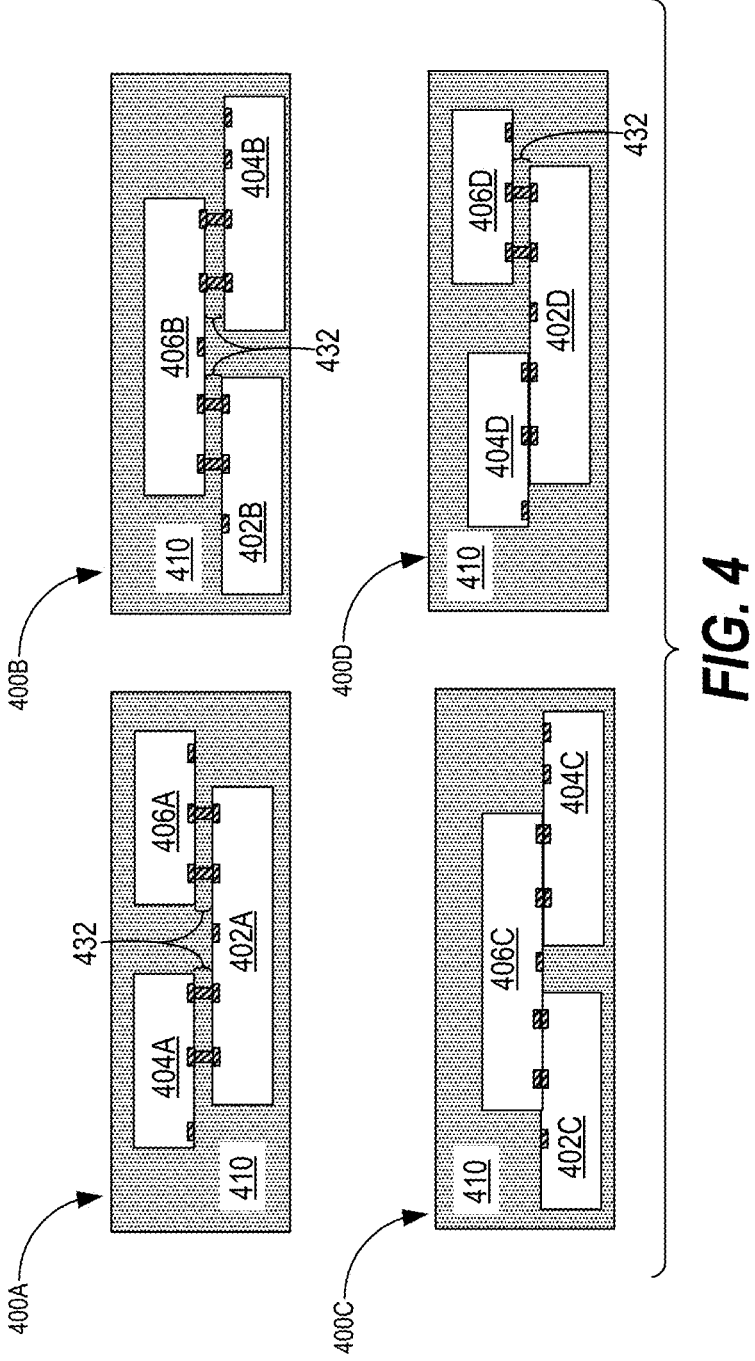
FIG. 4 shows cross-sectional views of four example arrangements of devices within a multi-chip package according to one or more embodiments.

As above, examples herein are not intended to limit embodiments to a particular arrangement of stacked die in packages such as the packages 100, 300 described in connection with FIGS. 1-3. As indicated above, embodiments herein are not limited to only two die or other components with a volume of molding material. Accordingly, FIG. 4 shows cross-sectional views of four example arrangements of die within a volume of molding material 410.

In the arrangement 400A, two die 404A, 406B are bonded to a die 402A in a stacked arrangement and electrically coupled to the die 402A via direct interconnects 432 (e.g., direct interconnects 132).

In the arrangement 400B, the die 406B is bonded to two die 402B, 404B and electrically coupled to both of the die 402B, 404B via direct interconnects 432 depicted as metal pillars (e.g., direct interconnects 132).

In the arrangement 4000, the die 406C is directly bonded to the two die 402C, 404C and electrically coupled to both of the die 402B, 404B without the need for intervening direct interconnects 432 (e.g., using a conductive adhesive, direct metallurgical bonding of contacts on the surface of each device, or hybrid bonding techniques).

In the arrangement 400D, the die 406D is directly bonded to the two die 402D, 404D and electrically coupled to both of the die 402B, 404B. The die 402D is directly bonded to the die 404D and bonded to the die 406D via direct interconnects 432.

Figure 5:
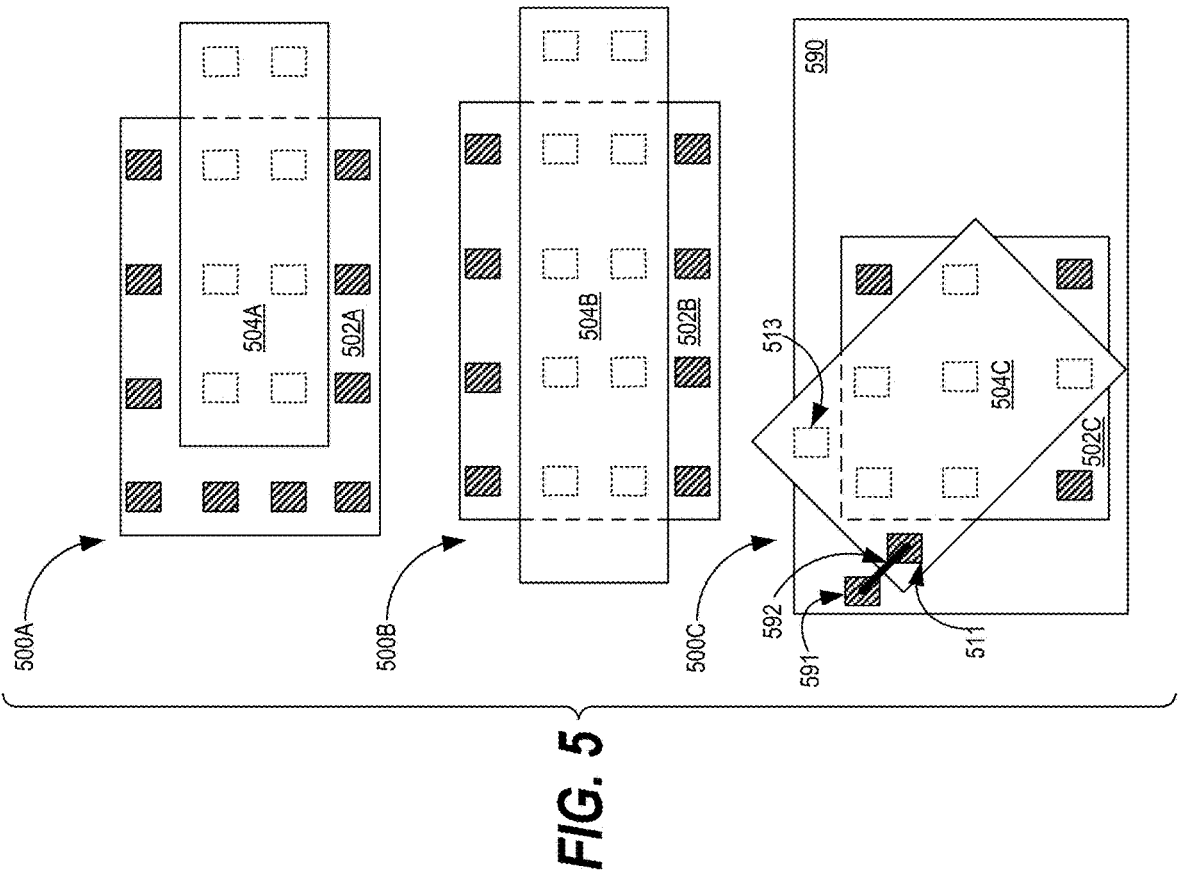
FIG. 5 shows plan views of three example arrangements of devices within a multi-chip package according to one or more embodiments.

Packages according to embodiments herein also allow for die to be arranged with any suitable orientations relative to other die, as shown in FIG. 5 which shows plan views of example arrangements of two die for purposes of illustration. It should be appreciated that the various arrangements of FIG. 5 and related arrangements can be useful to provide access to particular contact pads on an underlying die such as the die 502A, 502B, or 502C and/or to optimize the location of contact pads of an overlying die such as the die 504A, 504B, or 504C.

In the arrangement 500A, two die 502A, 504A (e.g., the die 102, 104, or the die 302, 304) are coupled such that the die 504A is partially suspended above the die 502A (i.e., a portion of the die 504A extends beyond the footprint of the die 502A and vice versa). While the short sides of the die 504A are shown centered between the short sides of the die 502A, it will be understood that any suitable orientation of one die relative to another is possible. The hatched areas of the die 502A indicate positions of contact pads of the die 502A that face "upward" and are not obscured by the die 504A. The dashed areas within the boundary of the die 504A indicate the locations of contact pads of the die 504A that are bonded to corresponding contact pads of the die 502A which are obscured by the die 504A (i.e., the obscured contacts are on a surface of the die 504A opposite the surface visible FIG. 5).

In the arrangement 500B, two die 502B, 504B (e.g., the die 102, 104, or the die 302, 304) are coupled such that the die 504B is partially suspended above the die 502B and extends beyond the footprint of the die 502B along two opposite edges of the die 502B.

In the arrangement 5000, two die 502C, 504C (e.g., the die 102, 104, or the die 302, 304) are coupled such that the die 504C is partially suspended above the die 502C and extends beyond the footprint of the die 502C. The die 504C is also rotated with respect to the die 502C and the die 504C is shown with a contact on its "upper" surface (indicated by shading). As shown, a die such as the die 504C can be rotated relative to an underlying die such as the die 502C to reduce the length required for a wire bond 592 from the contact 511 on the die 504C to a contact 591 on a substrate 590 underlying both the die 502C and the die 504C. This arrangement can also allow connection of a die such as the die 504C to multiple die and/or substrates (e.g., the die 504C can be connected via contacts on its underside indicated by dashes as shown in FIG. 5C to the die 502C and also connected to one or more contacts on the substrate 590 via a contact such as the contact 513 which is positioned on a portion of the die 504C that extends beyond the footprint of the die 502C).

Figure 6:
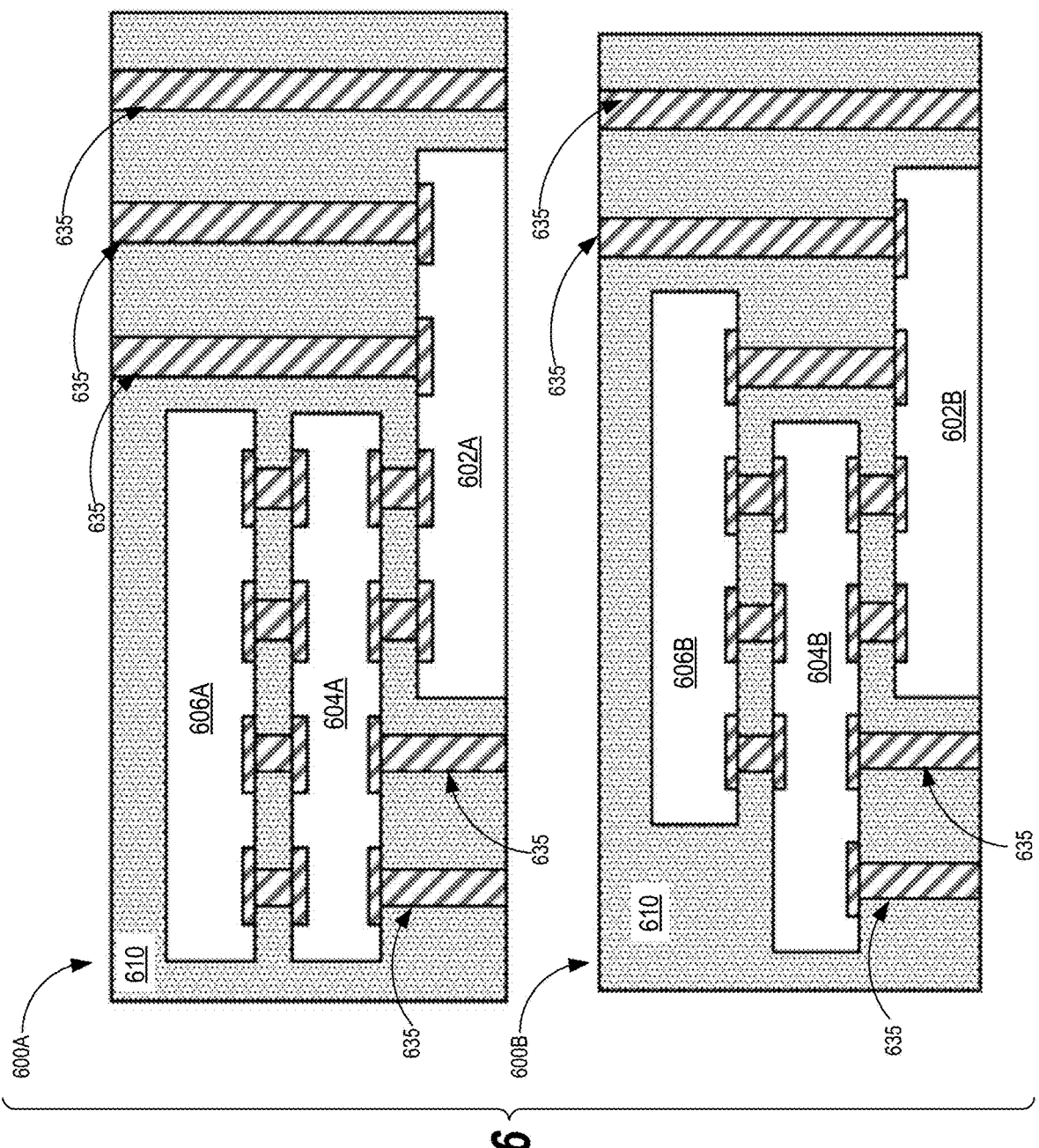
FIG. 6 shows cross-sectional views of two example arrangements of three die stacked in a package according to one or more embodiments.

FIG. 6 shows cross-sectional views of non-limiting example arrangements of three die and various through-package interconnects 635 to further illustrate stacking of multiple die within a volume of molding material such as a volume of molding material 110, 310, or 410. In the arrangement 600A, the die 604A partially overlies the die 602A and is connected to the die 602A as shown. Contacts on the die 602A, 604A are exposed through the volume of molding material 610 via through-package interconnects 635, as shown. A die 606A is stacked on the die 604A and connected directly to the die 604A. An additional through-package interconnect 635 (e.g., a through-package interconnect such as the through-package interconnect 135e) passes through the entire height of the volume of molding material 610.

The arrangement 600B shows a related arrangement of three die 602B, 604B, and 606B within the volume of molding material 610 in which one the die (the die 606B) is coupled to a first die (the die 604B) directly beneath it and also to a second die (the die 602B) which is beneath both the die 606B and the die 604B.

Figure 7:
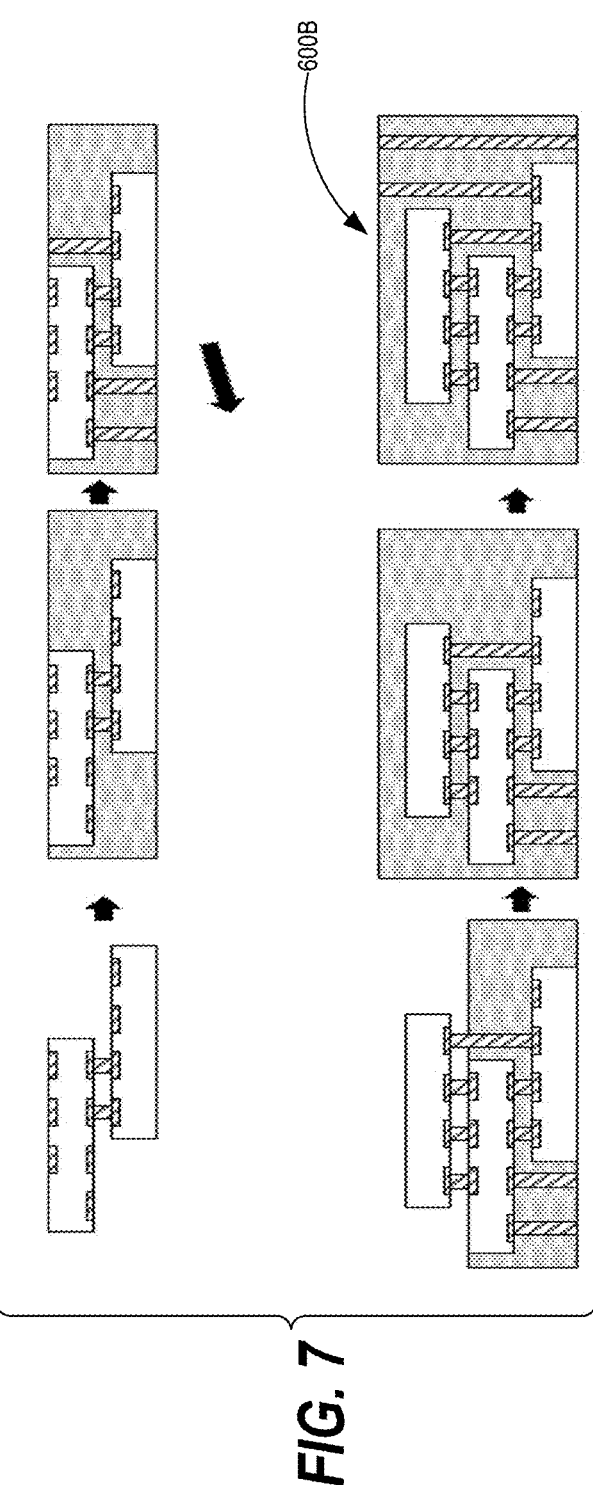
FIG. 7 is a cross-sectional illustration of steps in an example process suitable for forming an arrangement of die as shown in FIG. 6 according to one or more embodiments.

FIG. 7 is a simplified process flow diagram showing the arrangement 600B during different stages of a fabrication process related to the process 200 of FIG. 2). As shown, a process such as the process 200 and/or similar processes can be modified to accommodate stacking of multiple die and formation of desired through-package interconnects. For example, a volume of molding material such as a volume of molding material 110, 310, 410, 510, or 610 can be formed in stages to facilitate stacking of three (or more) die.

It will be understood that the packages 100, 300 and the arrangements 400A, 400B, 4000, 400D, 500A, 500B, 5000, 600A, and 600B are examples for the purposes of illustration and are not intended to limit embodiments to any one configuration of die and other components or any one configuration of redistribution layers and interconnects. Thus, a package according to embodiments herein may have any suitable number and arrangement of die and other components; any suitable number and arrangement of redistribution layers with conductive interconnects; and any suitable number and arrangement of through-package interconnects, direct interconnects, through-substrate vias, and the like. Furthermore, packages according to embodiments herein may include die of different sizes, thickness, and shapes and can include additional substrates such as printed circuit boards, and the like.

Various Examples

Features of embodiments may be understood by way of one or more of the following examples:

Example 1: A device or method in which a first electronic component has a first surface provided with electrical contact pads and a second surface opposite the first surface; and a second electronic component has a first surface provided with electrical contact pads and a second surface opposite the first surface. The first surface of the second electronic component is bonded to the first surface of the first electronic component and a volume of molding material encapsulates the first electronic component and the second electronic component. The device or method also includes an upper set of redistribution layers, a lower set of redistribution layers, and a through-package interconnect that passes through the volume of molding material.

The upper set of redistribution layers is formed from layers of electrically-insulating material that surround a first set of electrically conductive interconnects, where the upper set of redistribution layers extends from a first surface of the volume of molding material to an upper redistribution layer ("RDL") surface. The lower set of redistribution layers is formed from layers of electrically-insulating material that surround a second set of electrically conductive interconnects. The lower set of redistribution layers extends from a second surface of the volume of molding material that is opposite the first surface of the volume of molding material to a lower RDL surface.

The through-package interconnect electrically couples an electrically conductive interconnect in a first redistribution layer to an electrically conductive interconnect in a second redistribution layer on an opposite side of the volume of molding material from the first redistribution layer; or the through-package interconnect electrically couples an electrically conductive interconnect in the first redistribution layer to an electrical contact pad belonging to the first electronic component or an electrical contact pad belonging the second electronic component.

Example 2: The device or method of Example 1, where the first electronic component and the second electronic component are electrically coupled to each other via corresponding electrical contact pads on the first surface of the first electronic component and on the first surface of the second electronic component that are bonded to each other.

Example 3: The device or method of Example 1 or Example 2, in which the through-package interconnect is a first through-package interconnect that electrically couples an electrically conductive interconnect in the upper set of redistribution layers to an electrically conductive interconnect in the lower set of redistribution layers. The second electronic device is disposed between the first electronic device and the upper set of redistribution layers. The first surface of the first electronic component has an extended portion that extends beyond a footprint of the second electronic component. The electronic device package further includes a second through-package interconnect that electrically couples an electrically conductive interconnect in the upper set of redistribution layers to an electrical contact pad on the extended portion of the first surface of the first electronic component.

Example 4: The device or method of any of Examples 1-3, in which the through-package interconnect is a first through-package interconnect that electrically couples an electrically conductive interconnect in the upper set of redistribution layers to an electrically conductive interconnect in the lower set of redistribution layers. The first electronic component is disposed between the second electronic component and the lower set of redistribution layers; and the first surface of the second electronic component has an extended region that extends beyond a footprint of first electronic component. The electronic device package further includes a second through-package interconnect that electrically couples an electrically conductive interconnect in the lower set of redistribution layers to an electrical contact pad on the extended portion of the first surface of the second electronic component.

Example 5: The device or method of any of Examples 1-4, in which the through-package interconnect is electrically coupled, at a first end of the through-package interconnect, to an electrical interconnect in the upper set of redistribution layers or an electrical interconnect in the lower set of redistribution layers. The through-package interconnect includes a conductive via that passes through the first electronic component or the second electronic component that is disposed between the first end of the through-package interconnect and a second end of the through-package interconnect.

Example 6: The device or method of any of Examples 1-5, in which a selected component is the first electronic component or the second electronic component. The second surface of the selected component is disposed at a surface of the volume of molding material that is adjacent to the upper RDL surface or adjacent the lower RDL surface. The second surface of the selected component includes an electrical contact that is bonded to an electrical interconnect in the upper set of redistribution layers or an electrical interconnect in the lower set of redistribution layers.

Example 7: The device or method of any of Examples 1-6, in which a portion of the through-package interconnect is formed by an electrically conductive via that passes through the first electronic component or the second electronic component.

Example 8: The device or method of any of Examples 1-7, in which the through-package interconnect is a first through-package interconnect that electrically couples an electrically conductive interconnect in the upper set of redistribution layers to an electrically conductive interconnect in the lower set of redistribution layers. The electronic device package further includes a second through-package interconnect that passes through the volume of molding material and includes a portion formed by an electrically conductive via that passes through the first electronic component or the second electronic component.

Example 9: The device or method of any of Examples 1-8, in which the first electronic component is a rectangular device has an orientation defined by a first axis that is perpendicular to an edge of the first electronic component and parallel to a surface of the first electronic device. The second electronic component is a rectangular device has an orientation defined by a second axis that is perpendicular to an edge of the second electronic component and parallel to a surface of the second electronic device; and the first axis is neither parallel nor perpendicular to the second axis.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. An electronic device package, comprising:
a first electronic component having a first surface provided with electrical contact pads and a second surface opposite the first surface;
a second electronic component having a first surface provided with electrical contact pads and a second surface opposite the first surface, wherein the first surface of the second electronic component is bonded to the first surface of the first electronic component;
a volume of molding material that encapsulates the first electronic component and the second electronic component;
an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
a first through-package interconnect that passes through the volume of molding material;
wherein the first through-package interconnect electrically couples:
an electrically conductive interconnect in a first redistribution layer to an electrically conductive interconnect in a second redistribution layer on an opposite side of the volume of molding material from the first redistribution layer; or
an electrically conductive interconnect in the first redistribution layer to an electrical contact pad belonging to the first electronic component or an electrical contact pad belonging the second electronic component;
wherein the first surface of the first electronic component has an extended portion that extends beyond a footprint of the second electronic component;
wherein the electronic device package further comprises a second through-package interconnect that electrically couples an electrically conductive interconnect in the upper set of redistribution layers to an electrical contact pad on the extended portion of the first surface of the first electronic component.

2. The electronic device package of claim 1,
wherein the first electronic component and the second electronic component are electrically coupled to each other via corresponding electrical contact pads on the first surface of the first electronic component and on the first surface of the second electronic component that are bonded to each other.

3. The electronic device package of claim 1,
wherein the first through-package interconnect electrically couples an electrically conductive interconnect in the upper set of redistribution layers to an electrically conductive interconnect in the lower set of redistribution layers;
wherein the first electronic component is disposed between the second electronic component and the lower set of redistribution layers; and
wherein the first surface of the second electronic component has an extended region that extends beyond a footprint of first electronic component; and
wherein the electronic device package further comprises a second through-package interconnect that electrically couples an electrically conductive interconnect in the lower set of redistribution layers to an electrical contact pad on the extended portion of the first surface of the second electronic component.

4. The electronic device package of claim 1,
wherein the first through-package interconnect is electrically coupled, at a first end of the first through-package interconnect, to an electrical interconnect in the upper set of redistribution layers or an electrical interconnect in the lower set of redistribution layers; and
wherein the first through-package interconnect includes a conductive via that passes through the first electronic component or the second electronic component that is disposed between the first end of the first through-package interconnect and a second end of the first through-package interconnect.

5. The electronic device package of claim 1,
wherein a selected component is the first electronic component or the second electronic component;
wherein the second surface of the selected component is disposed at a surface of the volume of molding material that is adjacent to the upper RDL surface or adjacent the lower RDL surface; and
wherein the second surface of the selected component includes an electrical contact that is bonded to an electrical interconnect in the upper set of redistribution layers or an electrical interconnect in the lower set of redistribution layers.

6. The electronic device package of claim 1,
wherein a portion of the first through-package interconnect is formed by an electrically conductive via that passes through the first electronic component or the second electronic component.

7. The electronic device package of claim 1,
wherein the first through-package interconnect electrically couples an electrically conductive interconnect in the upper set of redistribution layers to an electrically conductive interconnect in the lower set of redistribution layers; and
wherein the electronic device package further comprises a second through-package interconnect that passes through the volume of molding material and includes a portion formed by an electrically conductive via that passes through the first electronic component or the second electronic component.

8. An electronic device package, comprising:
a first electronic component having a first surface provided with electrical contact pads and a second surface opposite the first surface;
a second electronic component having a first surface provided with electrical contact pads and a second surface opposite the first surface, wherein the first surface of the second electronic component is bonded to the first surface of the first electronic component;
a volume of molding material that encapsulates the first electronic component and the second electronic component;
an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
a through-package interconnect that passes through the volume of molding material;
wherein the through-package interconnect electrically couples:
an electrically conductive interconnect in a first redistribution layer to an electrically conductive interconnect in a second redistribution layer on an opposite side of the volume of molding material from the first redistribution layer; or
an electrically conductive interconnect in the first redistribution layer to an electrical contact pad belonging to the first electronic component or an electrical contact pad belonging the second electronic component;
wherein the through-package interconnect is a first through-package interconnect that electrically couples an electrically conductive interconnect in the upper set of redistribution layers to an electrically conductive interconnect in the lower set of redistribution layers;
wherein the second electronic component is disposed between the first electronic component and the upper set of redistribution layers;
wherein the first surface of the first electronic component has an extended portion that extends beyond a footprint of the second electronic component; and
wherein the electronic device package further comprises a second through-package interconnect that electrically couples an electrically conductive interconnect in the upper set of redistribution layers to an electrical contact pad on the extended portion of the first surface of the first electronic component.

9. An electronic device package, comprising:
a first electronic component having a first surface provided with electrical contact pads and a second surface opposite the first surface;
a second electronic component having a first surface provided with electrical contact pads and a second surface opposite the first surface, wherein the first surface of the second electronic component is bonded to the first surface of the first electronic component;
a volume of molding material that encapsulates the first electronic component and the second electronic component;
an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;
a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and
a through-package interconnect that passes through the volume of molding material;
wherein the through-package interconnect electrically couples:
an electrically conductive interconnect in a first redistribution layer to an electrically conductive interconnect in a second redistribution layer on an opposite side of the volume of molding material from the first redistribution layer; or
an electrically conductive interconnect in the first redistribution layer to an electrical contact pad belonging to the first electronic component or an electrical contact pad belonging the second electronic component;
wherein the first electronic component is a rectangular device having an orientation defined by a first axis that is perpendicular to an edge of the first electronic component and parallel to a surface of the first electronic component;
wherein the second electronic component is a rectangular device having an orientation defined by a second axis that is perpendicular to an edge of the second electronic component and parallel to a surface of the second electronic component; and
wherein the first axis is neither parallel nor perpendicular to the second axis.

10. A method, comprising:
providing a first electronic component having a first surface provided with electrical contact pads and a second surface opposite the first surface; and receiving a second electronic component having a first surface provided with electrical contact pads and a second surface opposite the first surface;
wherein the first surface of the second electronic component is bonded to the first surface of the first electronic component;
wherein a volume of molding material encapsulates the first electronic component and the second electronic component;
wherein the first surface of the first electronic component has an extended portion that extends beyond a footprint of the second electronic component;

wherein the method further comprises:

forming an upper set of redistribution layers from layers of electrically-insulating material that surround a first set of electrically conductive interconnects, wherein the upper set of redistribution layers extends from a first surface of the volume of molding material to an upper redistribution layer ("RDL") surface;

forming a lower set of redistribution layers from layers of electrically-insulating material that surround a second set of electrically conductive interconnects, wherein the lower set of redistribution layers extends from a second surface of the volume of molding material that is opposite the first surface of the volume of molding material to a lower RDL surface;

forming a first through-package interconnect that passes through the volume of molding material; and forming a second through-package interconnect that electrically couples an electrically conductive interconnect in the upper set of redistribution layers to an electrical contact pad on the extended portion of the first surface of the first electronic component; and wherein the first through-package interconnect electrically couples:

an electrically conductive interconnect in a first redistribution layer to an electrically conductive interconnect in a second redistribution layer on an opposite side of the volume of molding material from the first redistribution layer; or an electrically conductive interconnect in the first redistribution layer to an electrical contact pad belonging to the first electronic component or an electrical contact pad belonging the second electronic component.

11. The method of claim 10, wherein the first electronic component and the second electronic component are electrically coupled to each other via corresponding electrical contact pads on the first surface of the first electronic component and on the first surface of the second electronic component that are bonded to each other.

12. The method of claim 10, wherein the first through-package interconnect electrically couples an electrically conductive interconnect in the upper set of redistribution layers to an electrically conductive interconnect in the lower set of redistribution layers;

wherein the first electronic component is disposed between the second electronic component and the lower set of redistribution layers; and wherein the first surface of the second electronic component has an extended region that extends beyond a footprint of first electronic component; and wherein the method further comprises forming a second through-package interconnect that electrically couples an electrically conductive interconnect in the lower set of redistribution layers to an electrical contact pad on the extended portion of the first surface of the second electronic component.

13. The method of claim 10, wherein the first through-package interconnect is electrically coupled, at a first end of the first through-package interconnect, to an electrical interconnect in the upper set of redistribution layers or an electrical interconnect in the lower set of redistribution layers; and wherein the first through-package interconnect includes a conductive via that passes through the first electronic component or the second electronic component that is disposed between the first end of the first through-package interconnect and a second end of the first through-package interconnect.

14. The method of claim 10, wherein a selected component is the first electronic component or the second electronic component;

wherein the second surface of the selected component is disposed at a surface of the volume of molding material that is adjacent to the upper RDL surface or adjacent the lower RDL surface; and wherein the second surface of the selected component includes an electrical contact that is bonded to an electrical interconnect in the upper set of redistribution layers or an electrical interconnect in the lower set of redistribution layers.

15. The method of claim 10, wherein a portion of the first through-package interconnect is formed by an electrically conductive via that passes through the first electronic component or the second electronic component.

16. The method of claim 10, wherein the first through-package interconnect electrically couples an electrically conductive interconnect in the upper set of redistribution layers to an electrically conductive interconnect in the lower set of redistribution layers; and wherein the method further comprises a second through-package interconnect that passes through the volume of molding material and includes a portion formed by an electrically conductive via that passes through the first electronic component or the second electronic component.

17. The method of claim 10, further comprising bonding the first surface of the second electronic component to the first surface of the first electronic component.

18. A method, comprising:

providing a first electronic component having a first surface provided with electrical contact pads and a second surface opposite the first surface; and receiving a second electronic component having a first surface provided with electrical contact pads and a second surface opposite the first surface;

wherein the first surface of the second electronic component is bonded to the first surface of the first electronic component;

wherein a volume of molding material encapsulates the first electronic component and the second electronic component;

wherein the method further comprises:

forming an upper set of redistribution layers from layers of electrically-insulating material that surround a first set of electrically conductive interconnects, wherein the upper set of redistribution layers extends from a first surface of the volume of molding material to an upper redistribution layer ("RDL") surface;

forming a lower set of redistribution layers from layers of electrically-insulating material that surround a second set of electrically conductive interconnects, wherein the lower set of redistribution layers extends from a second surface of the volume of molding material that is opposite the first surface of the volume of molding material to a lower RDL surface; and forming a through-package interconnect that passes through the volume of molding material; and wherein the through-package interconnect electrically couples:

an electrically conductive interconnect in a first redistribution layer to an electrically conductive interconnect in a second redistribution layer on an opposite side of the volume of molding material from the first redistribution layer; or an electrically conductive interconnect in the first redistribution layer to an electrical contact pad belonging to the first electronic component or an electrical contact pad belonging the second electronic component;

wherein the through-package interconnect is a first through-package interconnect that electrically couples an electrically conductive interconnect in the upper set of redistribution layers to an electrically conductive interconnect in the lower set of redistribution layers;

wherein the second electronic component is disposed between the first electronic component and the upper set of redistribution layers;

wherein the first surface of the first electronic component has an extended portion that extends beyond a footprint of the second electronic component; and wherein the method further comprises forming a second through-package interconnect that electrically couples an electrically conductive interconnect in the upper set of redistribution layers to an electrical contact pad on the extended portion of the first surface of the first electronic component.

19. A method, comprising:

providing a first electronic component having a first surface provided with electrical contact pads and a second surface opposite the first surface; and receiving a second electronic component having a first surface provided with electrical contact pads and a second surface opposite the first surface;

wherein the first surface of the second electronic component is bonded to the first surface of the first electronic component;

wherein a volume of molding material encapsulates the first electronic component and the second electronic component;

wherein the method further comprises:

forming an upper set of redistribution layers from layers of electrically-insulating material that surround a first set of electrically conductive interconnects, wherein the upper set of redistribution layers extends from a first surface of the volume of molding material to an upper redistribution layer ("RDL") surface;

forming a lower set of redistribution layers from layers of electrically-insulating material that surround a second set of electrically conductive interconnects, wherein the lower set of redistribution layers extends from a second surface of the volume of molding material that is opposite the first surface of the volume of molding material to a lower RDL surface; and forming a through-package interconnect that passes through the volume of molding material; and wherein the through-package interconnect electrically couples:

an electrically conductive interconnect in a first redistribution layer to an electrically conductive interconnect in a second redistribution layer on an opposite side of the volume of molding material from the first redistribution layer; or an electrically conductive interconnect in the first redistribution layer to an electrical contact pad belonging to the first electronic component or an electrical contact pad belonging the second electronic component;

wherein the first electronic component is a rectangular device having an orientation defined by a first axis that is perpendicular to an edge of the first electronic component and parallel to a surface of the first electronic component;

wherein the second electronic component is a rectangular device having an orientation defined by a second axis that is perpendicular to an edge of the second electronic component and parallel to a surface of the second electronic component; and wherein the first axis is neither parallel nor perpendicular to the second axis.

20. An electronic device package, comprising:

a first electronic component having a first surface provided with electrical contact pads and a second surface opposite the first surface;

a second electronic component having a first surface provided with electrical contact pads and a second surface opposite the first surface, wherein the first surface of the second electronic component is bonded to the first surface of the first electronic component;

a volume of molding material that encapsulates the first electronic component and the second electronic component;

an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;

a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and a first through-package interconnect that passes through the volume of molding material;

wherein the first through-package interconnect electrically couples an electrically conductive interconnect in a first redistribution layer to an electrically conductive interconnect in a second redistribution layer on an opposite side of the volume of molding material from the first redistribution layer;

wherein the first surface of the first electronic component has an extended portion that extends beyond a footprint of the second electronic component;

wherein the electronic device package further comprises a second through-package interconnect that electrically couples an electrically conductive interconnect in the upper set of redistribution layers to an electrical contact pad on the extended portion of the first surface of the first electronic component.

21. An electronic device package, comprising:

a first electronic component having a first surface provided with electrical contact pads and a second surface opposite the first surface;

a second electronic component having a first surface provided with electrical contact pads and a second surface opposite the first surface, wherein the first surface of the second electronic component is bonded to the first surface of the first electronic component;

a volume of molding material that encapsulates the first electronic component and the second electronic component;

an upper set of redistribution layers formed from layers of electrically-insulating material that surround a first set of electrically conductive interconnects, wherein the upper set of redistribution layers extends from a first surface of the volume of molding material to an upper redistribution layer ("RDL") surface;

a lower set of redistribution layers formed from layers of electrically-insulating material that surround a second set of electrically conductive interconnects, wherein the lower set of redistribution layers extends from a second surface of the volume of molding material that is opposite the first surface of the volume of molding material to a lower RDL surface; and a first through-package interconnect that passes through the volume of molding material;

wherein the first through-package interconnect electrically couples an electrically conductive interconnect in the upper set of redistribution layers to one selected from the group that consists of an electrical contact pad belonging to the first electronic component and an electrical contact pad belonging the second electronic component;

wherein the first surface of the first electronic component has an extended portion that extends beyond a footprint of the second electronic component;

wherein the electronic device package further comprises a second through-package interconnect that electrically couples an electrically conductive interconnect in the upper set of redistribution layers to an electrical contact pad on the extended portion of the first surface of the first electronic component.

* * * * *